United States Patent
Ligtenberg

(10) Patent No.: US 8,077,479 B2
(45) Date of Patent: Dec. 13, 2011

(54) APPARATUS FOR REDUCING ELECTROMAGNETIC INTERFERENCE AND SPREADING HEAT

(75) Inventor: Chris Ligtenberg, San Carlos, CA (US)

(73) Assignee: Apple Inc., Cupertino, CA (US)

( * ) Notice: Subject to any disclaimer, the term of this patent is extended or adjusted under 35 U.S.C. 154(b) by 967 days.

(21) Appl. No.: 12/034,104

(22) Filed: Feb. 20, 2008

(65) Prior Publication Data

US 2009/0207578 A1 Aug. 20, 2009

(51) Int. Cl.
*H05K 9/00* (2006.01)

(52) U.S. Cl. .................... 361/816; 361/799; 361/800

(58) Field of Classification Search ............... 361/816, 361/818, 799, 600, 679.01, 800, 687, 688, 361/696, 697, 701–704, 711, 713; 174/51, 174/35 R; 340/500, 691.1, 692, 825.69, 340/255, 270; 455/73, 74
See application file for complete search history.

(56) References Cited

U.S. PATENT DOCUMENTS

| | | | |
|---|---|---|---|
| 6,195,267 B1 * | 2/2001 | MacDonald et al. | 361/800 |
| 7,245,896 B2 * | 7/2007 | Seo et al. | 455/300 |
| 7,262,369 B1 * | 8/2007 | English | 174/370 |
| 7,623,349 B2 * | 11/2009 | Refai-Ahmed et al. | 361/719 |
| 2007/0076396 A1 * | 4/2007 | Kim | 361/796 |
| 2008/0074329 A1 | 3/2008 | Caballero et al. | |
| 2008/0165071 A1 | 7/2008 | Chiang et al. | |
| 2008/0291617 A1 | 11/2008 | DiFonzo et al. | |
| 2008/0291620 A1 | 11/2008 | DiFonzo et al. | |
| 2008/0297695 A1 * | 12/2008 | Sekiguchi et al. | 349/65 |
| 2009/0040129 A1 | 2/2009 | Degner et al. | |

* cited by examiner

*Primary Examiner* — Hung S Bui
(74) *Attorney, Agent, or Firm* — Beyer Law Group LLP

(57) ABSTRACT

A radio module for use in an electronic device is disclosed. The radio module has a shield for reducing electromagnetic interference on the radio module. The shield may include a heat-spreading layer made of a material including graphite. The heat-spreading layer may spread heat generated by the radio module. The shield may also include a reflective layer overlapping the heat-spreading layer and configured to reflect electromagnetic energy to the heat-spread layer. The heat-spreading layer is also configured to absorb at least a portion of the electromagnetic energy, thereby reducing the electromagnetic interference on the radio module.

25 Claims, 2 Drawing Sheets

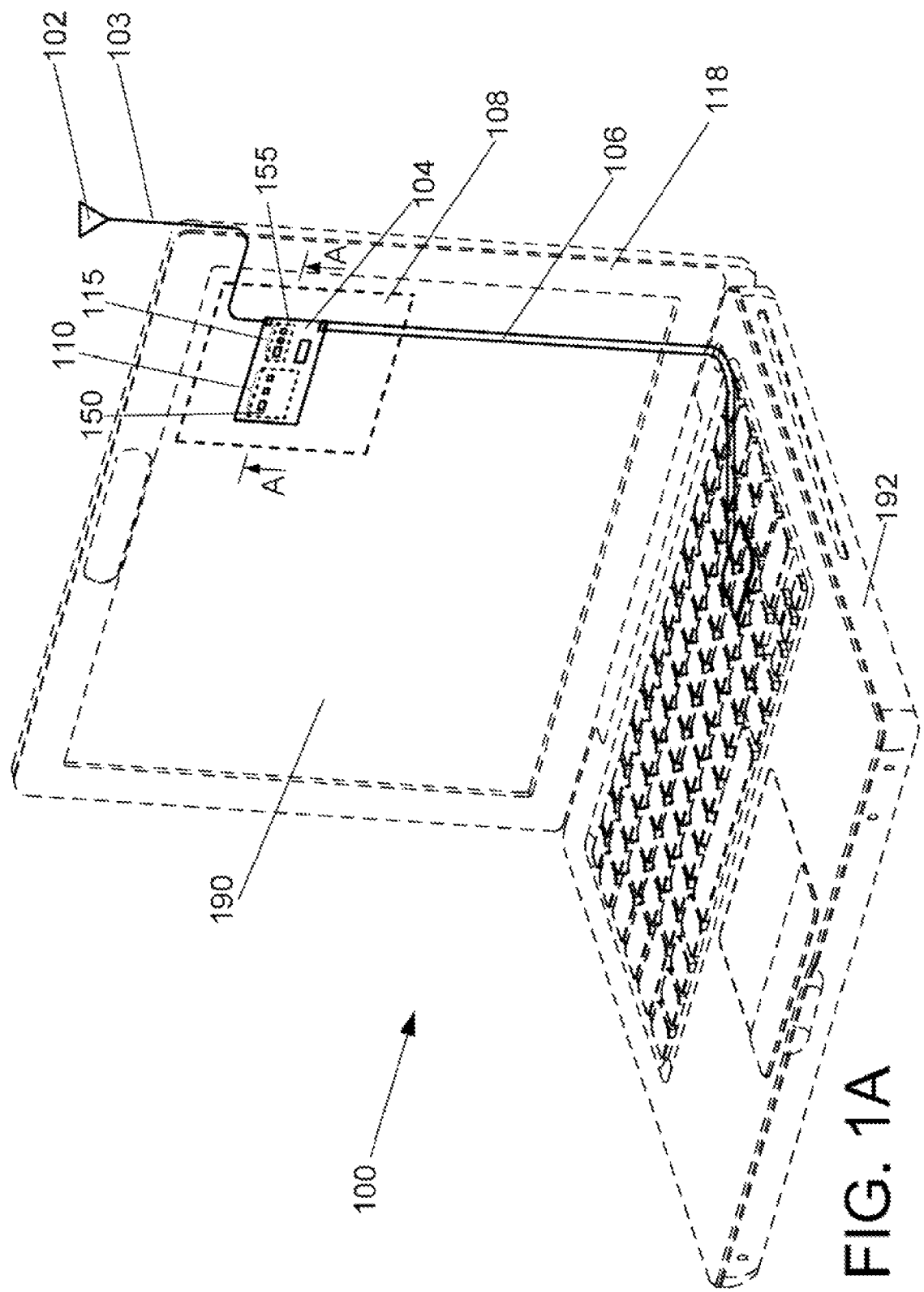

APPARATUS FOR REDUCING ELECTROMAGNETIC INTERFERENCE AND SPREADING HEAT

BACKGROUND OF THE INVENTION

In the electronic device industry, more and more electronic devices are equipped with wireless communication capabilities based on one or more wireless communication standards, such as WCDMA (UMTS), CDMA2000, Wi-Fi, WiMAX, etc. An electronic device equipped with wireless communication capability may have a radio module that includes components for baseband modulation, analog-digital signal conversion, etc.

Typically, at least some components in the radio module may be sensitive to electromagnetic noise from other components in the electronic device. For example, the ambient noise may need to be under −106 dB for atypical radio module to function properly. However, various components in the electronic device may generate electromagnetic noise of undesirably high levels and may interfere with the operation of the radio module. There is thus a need to effectively reduce electromagnetic interference (EMI) on the radio module.

Further, some components in the radio module may generate a significant amount of heat. If the radio module operates near a component that is sensitive to high temperature, the performance of that component may be compromised. For example, if the radio module is disposed close to a display module, the heat generated by components in the radio module may create an area of visible, undesirable high-contrast ratio on the display. The durability of the display module also may be compromised. There also may be a need to minimize the effect of beat generated by the radio module on heat-sensitive components of the electronic device.

Separate structures for EMI reduction and heal insulation/spreading may be implemented. However, the separate EMI reduction and heat spreading structures may require a significant amount of space in an electronic device. The separate structures may also incur significant manufacturing and material costs for the electronic device.

SUMMARY OF INVENTION

An embodiment of the present invention relates to a radio module for use in an electronic device. The radio module has a shield for reducing electromagnetic interference on the radio module. The shield may include a heat-spreading layer made of a material including graphite. The heat-spreading layer may spread heat generated by the radio module. The shield may also include a reflective layer overlapping the heat-spreading layer and configured to reflect electromagnetic energy to the heat-spread layer. The beat-spreading layer is also configured to absorb at least a portion of the electromagnetic energy, thereby reducing the electromagnetic interference on the radio module.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which;

FIG. 1A illustrates a schematic representation of a perspective view of an electronic device in accordance with one or more embodiments of the present invention.

DETAILED DESCRIPTION OF EMBODIMENTS

Figure 1B:
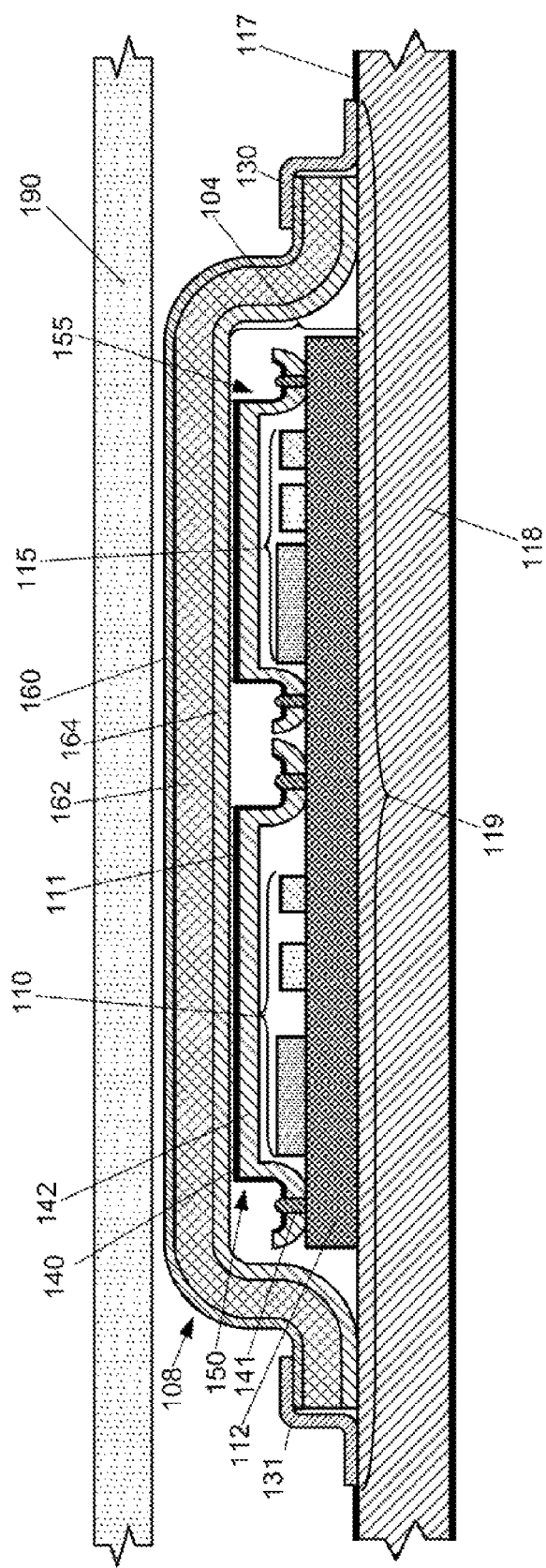
FIG. 1B illustrates a schematic representation of a partial cross-sectional view of the electronic device in accordance with one or more embodiments of the present invention.

The present invention will now be described in detail with reference to a few embodiments thereof as illustrated in the accompanying drawings, in the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

One or more embodiments of the invention relate to a shield for reducing electromagnetic interference on a radio module in an electronic device. The shield may include a heat-spreading layer made of a material including graphite. The heat-spreading layer may be configured to spread heat generated by the radio module. The heat-spreading layer may also be configured to absorb at least a portion of the electromagnetic energy that contributes to the electromagnetic interference (EMI). The shield may also include a reflective layer overlapping at least a portion of the heat-spreading layer. The reflective layer may be made of a metal material. The reflective layer may be configured to reflect the electromagnetic energy to the heat-spread layer.

The shield may further include an insulator configured to secure or adhere to the heat-spreading layer. The insulator is made of a material including one or more of plastic, paper, and glass.

The shield may be disposed on a circuit board of the radio module, and the reflective layer may be grounded through the circuit board. Alternatively or additionally, the shield may be disposed on an enclosure member of the electronic device, and the reflective layer may be electrically coupled with the enclosure member of the electronic device. At least a portion of the shield is disposed between the radio module and a display module.

One or more embodiments of the invention relate to an electronic device that implements such a heat-dissipating/EMI shield. For example, the electronic device may represent a portable computing, communication, storage, and/or entertainment device.

The electronic device may include a radio module including a first component set. The electronic device may include a first shield covering the radio module. Alternatively or additionally, the first shield may enclose the radio module. At least a portion of the first shield may be disposed between the radio module and a display module. A surface of the first shield may overlap a side of the radio module. The area of the surface of the first shield may be at least three times the area of the side of the radio module.

The first shield may include a heat-spreading layer. The heat-spreading layer may be made of a material including graphite. The heat-spreading layer may be configured to spread heat generated by at least the first component set. The heat-spreading layer may also be configured to absorb electromagnetic energy for reducing electromagnetic interference on the radio module.

The first shield may also include a reflective layer overlapping at least a portion of the heat-spreading layer. The reflective layer may be configured to reflect electromagnetic energy to the heat-spread layer. The reflective layer may be made of a metal material including, for example, one or more of aluminum and copper.

The electronic device may also include an insulator coupled to the heat-spreading layer and configured to insulate the display module from the radio module. The insulator may also be configured to secure the heat-spreading layer in place.

The electronic device may also include an enclosure member electrically coupled with at least a portion, e.g., the reflective layer, of the first shield. The enclosure member may be configured to at least partially contain at least one of the radio module and the first shield. The enclosure member may be further configured to support a display module. The electronic device may also include one or more conductive units configured to electrically couple the enclosure member with the at least the portion of the first shield and to secure the first shield on the enclosure member.

The electronic device may also include a second shield, covered by the first shield and covering the first component set. The second shield may be configured to reduce intra-module electromagnetic interference between a second component set in the radio module and the first component set. The second shield may include an outer layer made of an electrically conductive material. At least a portion, e.g., the outer layer, of the second shield may be electrically grounded through one or more solder units.

The second shield may also include an inner layer made of a material including one or more of plastic and graphite.

The electronic device may also include an adhesive element disposed between the first shield and the second shield. The adhesive may be configured to bind the first shield to the second shield.

The electronic device may also include a third shield covered by the first shield and covering the second component set. The third shield may be configured to reduce the infra-module electromagnetic interference between the second component set and the first component set.

The features and advantages of the present invention may be better understood with reference to the figures and discussions that follow.

FIG. 1A illustrates a schematic representation of a perspective view of an electronic device 100 in accordance with one or more embodiments of the present invention. Electronic device 100 may include antennae 102 configured to transmit and receive electromagnetic signals for wireless communication. Electronic device 100 may also include radio module 104 electrically coupled with antennae 102 through radio interconnect 103.

Radio module 104 may include one or more components sets, such as component set 110 and component set 115, for performing one or more of base bend modulation, signal conversion, etc. Radio module 104 may also include one or more EMI shields, such as EMI shield 150 covering component set 110, and EMI shield 155 covering component set 115 for reducing/preventing EMI between the one or more component sets. Radio module 104 may be electrically coupled with components disposed in base 192 of electronic device 100 through system interconnect 106, such as a digital interconnect. Radio module may be disposed behind display module 190 and housed by enclosure member 118 of disposed display module 190.

Electronic device 100 may also include shield 108 configured to reduce EMI on radio module 104 and to spread the heat generated by radio module 104. Shield 108 may effectively separate antennae 102 and radio module 104 from electromagnetic noise generated by other components of electronic device (such as display module 190 and components in base 192) and carried by system interconnect 106. Shield 108 may have an area that is significantly larger than the area of radio module 104 such that the concentration of heat may be substantially reduced. For example, the area of shield 108 may be at least three times the area of radio module 104. Shield 108 and EMI shields 150 and 155 may be further discussed with reference to a partial cross-sectional view A of electronic device 100 illustrated in the example of FIG. 1B.

FIG. 1B illustrates a schematic representation of a partial cross-sectional view of electronic device 100 in accordance with one or more embodiments of the present invention. As illustrated in the example of FIG. 1B, radio module 104 may be disposed on enclosure member 118 and under display module 190.

Enclosure member 118 may be made of a conductive material such as aluminum and may be anodized with an anodization layer 117 for erosion resistance and/or for aesthetic design. Part of anodization layer 117 may be removed (for example, etched away) to provide an unanodized area 119 for electrical coupling with radio module 104 as well as shield 108. Radio module 104 may include a circuit board 112 configured to accommodate component sets 110 and 115. A back plane of circuit board 112 may include a continuous copper layer electrically coupled with unanodized area 119, for example, for grounding.

On radio module 104, EMI shield 150 may be configured to cover component set 110 and may be covered by shield 108. EMI shield 150 may include an outer layer 140 made of a metal material and configured to shield component set 110 from electromagnetic interference. Outer layer 140 may be made of a conductive material, such as a metal material. Outer layer 140 may be electrically coupled with circuit board 112 through one or more solder units, such as solder unit 141, for example, for grounding. EMI shield 150 may also include an inner layer 142. Inner layer 142 may be made of a material that includes a plastic material. For example, the plastic material may include a polycarbonate material. Alternatively or additionally, inner layer 142 may be made of a material that includes graphite. For example, inner layer 142 may be made of a graphite composite material. Inner layer 241 may absorb electromagnetic energy and may convert the electromagnetic energy into thermal energy, or heat. Inner layer 241 may also laterally dissipate the heat. In one or more embodiments, EMI shield 150 may be a Gore-Shield®, available from W.L. Gore and Associates, Inc. of Newark, Del. EMI shield 150 may effectively reduce/prevent cross-talk between component set 110 and component set 115. EMI shield 155 may have a configuration that is similar to EMI shield 150.

Shield 108 also may be disposed on anodized area 119 and may cover radio module 104. Shield 108 may include a heat-spreading layer 162. Heat-spreading layer 162 may be made of a material that includes graphite. Heat-spreading layer 162 may be configured to absorb and laterally dissipate heat generated by radio module 104. Heat-spreading layer 162 may also be configured to absorb electromagnetic energy and convert the electromagnetic energy into thermal energy (i.e., heat) and laterally dissipate the heat, thereby, reducing ambient electromagnetic noise that may affect operation of radio module 104.

A substantial portion of shield 108 may be disposed between radio module 104 and display module 190. Accordingly, a substantial amount of heat generated by radio module 104 may be dissipated without reaching display module 190 or spread before reaching display module 190. As a result, the effect of heat generated by radio module 140 on display module 190 may be minimized. Advantageously, the performance and durability of display module 190 may not be affected by operation of radio module 104.

Shield 108 may also include an insulator 164 coupled with heat-spreading layer and configured to insulate display module 190 from radio module 104. Insulator may also be configured to secure heat-spreading layer 162 in place. Insulator 164 may be made of a material that includes one or more of a plastic material, glass, and paper.

Shield 108 may also include a reflective layer 160 substantially overlapping heat-spreading layer 162. Reflective layer 160 may be configured to reflect/deflect electromagnetic energy to heat-spreading layer 162. Reflective layer 162 may be made of a metal material, such as aluminum or copper, and may also be configured to provide structural support for heat-spreading layer 162. Reflective layer 160 may be electrically coupled with enclosure member 118 through one or more conductive units, such as conductive units 130 and 131, and uoanodixed area 119, for example, for grounding. In one or more embodiments, conductive units 130 and 131 may be extended portions of reflective layer 160. In one or more embodiments, conductive units 130 and 131 may be features of enclosure member 118 and may be configured to secure shield 108 on enclosure member 118.

Electronic device 100 may also include an adhesive element 111 disposed between shield 108 EMI and shield 150. Adhesive element 111 may be configured to bind shield 108 to EMI shield 150.

As can be appreciated from the foregoing, embodiments of the present invention may provide a single component that performs both heat dissipation/spreading and electromagnetic interference (EMI) reduction/prevention. Advantageously, ambient noise for a radio module may be substantially reduced, and the performance and durability of the radio module may be significantly improved. Further, there may be no local hot spot produced by operating a radio module, and there may be no visible defect in images shown on a display module.

According to embodiments of the invention, there may be no need to implement separate heat-spreading components and EMI reduction components. Advantageously, space in an electronic device may be conserved, and the form factor of the electronic device may be optimized. The material and manufacturing costs of the electronic device also may be reduced.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as Ml within the true spirit and scope of the present invention.

What is claimed is:

1. A radio module configured for use in an electronic device, the radio module having a shield configured to reduce electromagnetic interference on the radio module, the shield comprising:
    a heat-spreading layer made of a material including graphite, the heat-spreading layer configured to spread heat generated by the radio module;
    a reflective layer overlapping the heat-spreading layer and configured to reflect electromagnetic energy to the heat-spread layer, wherein the heat-spreading layer is also configured to absorb at least a portion of the electromagnetic energy, thereby reducing the electromagnetic interference on the radio module; and
    wherein at least a portion of the shield is disposed between the radio module and a display module.

2. The radio module of claim 1 wherein the shield is disposed on a circuit board of the radio module, and the reflective layer is electrically coupled with the circuit board.

3. The radio module of claim 1 wherein the shield is configured to be disposed on an enclosed member of the electronic device, and the reflective layer is configured to be electrically coupled with the enclosure member of the electronic device.

4. The radio module of claim 1 wherein the shield further comprises an insulator configured to secure the heat-spreading layer in place.

5. The electronic device of claim 1 further comprising one or more conductive units configured to electrically couple the enclosure member with the at least the portion of the first shield and to secure the first shield on the enclosure member.

6. An electronic device comprising:
    a radio module including a first component set; and
    a first shield covering the radio module, the first shield including a heat-spreading layer, the heat-spreading layer comprising a material including graphite, the heat-spreading layer configured to spread heat generated by the first component set and to absorb electromagnetic energy for reducing electromagnetic interference on the radio module; and
    an enclosure member electrically coupled with at least a portion of the first shield, the enclosure member configured to be coupled with at least one of the radio module and the first shield wherein the enclosure member is further configured to support a display module.

7. The electronic device of claim 6 wherein the first shield further includes a reflective layer overlapping the heat-spreading layer and configured to reflect electromagnetic energy to the heat-spread layer.

8. The electronic device of claim 7 further comprising an enclosure member electrically coupled with the reflective layer, the enclosure member configured to at least partially contained at least one of the radio module and the first shield.

9. The electronic device of claim 6 further comprising a second shield at least partially covered by the first shield and at least partially covering the first component set, the second shield configured to reduce intra-module interference between a second component set in the radio module and the first component set.

10. The electronic device of claim 9 wherein the second shield includes an outer layer made of an electrically conductive material, the outer layer being electrically grounded.

11. The electronic device of claim 9 wherein at least a portion of the second shield is electrically grounded through one or more solder units.

12. The electronic device of claim 9 wherein the second shield includes an inner layer made of a material including at least one of graphite and plastic.

13. The electronic device of claim 9 further comprising an adhesive element disposed between the first shield and the second shield, the adhesive configured to secure the first shield to the second shield.

14. The electronic device of claim 9 further comprising a third shield at least partially covered by the first shield and a least partially covering the second component set, the third shield being configured to reduce the intra-module interference between the second component set and the first component set.

15. The electronic device of claim 6 wherein the first shield at least partially encloses the radio module.

16. The electronic device of claim 6 wherein at least a portion of the first shield is disposed between the radio module and a display module.

17. The electronic device of claim 6 wherein a surface of the first shield overlaps a side of the radio module, and an area of the surface of the first shield is at least three times an area of the side of the radio module.

18. A radio module configured for use in an electronic device, the radio module having a shield configured to reduce electromagnetic interference on the radio module, the shield comprising:
  a heat-spreading layer made of a material including graphite, the heat-spreading layer configured to spread heat generated by the radio module;
  a reflective layer overlapping the heat-spreading layer and configured to reflect electromagnetic energy to the heat-spread layer, wherein the heat-spreading layer is also configured to absorb at least a portion of the electromagnetic energy, thereby reducing the electromagnetic interference on the radio module; and
  wherein at least a portion of the shield is disposed between the radio module and a display module.

19. The radio module of claim 18, wherein the shield is disposed on a circuit board of the radio module, and the reflective layer is electrically coupled with the circuit board.

20. The radio module of claim 18, wherein the shield is configured to be disposed on an enclosed member of the electronic device, and the reflective layer is configured to be electrically coupled with the enclosure member of the electronic device.

21. The radio module of claim 18, wherein at least a portion of the shield is disposed between the radio module and a display module.

22. An electronic device comprising:
  a radio module;
  a display; and
  means for spreading heat generated by the radio module; and
  means for reflecting electromagnetic energy to the means for spreading heat;
  wherein the means for spreading heat includes means for absorbing at least a portion of the electromagnetic energy; and
  wherein the means for spreading heat and the means for reflecting electromagnetic energy are located between the radio module and the display.

23. The electromagnetic device of claim 22, wherein the means for spreading heat is composed at least partially of graphite.

24. The electromagnetic device of claim 22, wherein the electronic device is a mobile phone.

25. The electromagnetic device of claim 22, wherein the electronic device is a portable media player.

* * * * *